United States Patent
Liu

(10) Patent No.: US 6,809,926 B2
(45) Date of Patent: Oct. 26, 2004

(54) HEAT SINK ASSEMBLY WITH EMBEDDED FAN

(75) Inventor: HeBen Liu, Shenzhen (CN)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 21 days.

(21) Appl. No.: 10/393,002

(22) Filed: Mar. 19, 2003

(65) Prior Publication Data

US 2004/0080911 A1 Apr. 29, 2004

(30) Foreign Application Priority Data

Oct. 25, 2002 (TW) ........................................ 91217050 U

(51) Int. Cl.[7] ............................................. H05K 7/20
(52) U.S. Cl. .................... 361/697; 165/80.3; 165/121; 165/185; 257/722; 361/703
(58) Field of Search .................. 165/80.3, 121, 165/122, 185; 361/697, 694–695, 703; 257/722; 454/184

(56) References Cited

U.S. PATENT DOCUMENTS

| | | | | |
|---|---|---|---|---|
| 5,309,983 A | * | 5/1994 | Bailey | 165/80.3 |
| 5,615,084 A | * | 3/1997 | Anderson et al. | 361/697 |
| 5,940,269 A | * | 8/1999 | Ko et al. | 361/697 |
| 6,304,445 B1 | | 10/2001 | Bollesen | |
| 6,401,807 B1 | * | 6/2002 | Wyler et al. | 165/121 |
| 6,625,021 B1 | * | 9/2003 | Lofland et al. | 361/697 |

FOREIGN PATENT DOCUMENTS

TW          319404          11/1997

* cited by examiner

Primary Examiner—Gregory D. Thompson
(74) Attorney, Agent, or Firm—Wei Te Chung

(57) ABSTRACT

A heat sink assembly includes a heat sink (10), a fan (20), and a retaining bar (30). The heat sink includes a base (12), and a plurality of parallel fins (14) extending upwardly from the base. The fins include a first outmost fin (18) and a second outmost fin (19) at opposite sides of the heat sink. The first outmost fin and intervening fins each define a longitudinal opening. All of the openings are aligned with each other, and cooperatively define a hexahedral chamber (16) that is parallel with the base. The fan is received in the chamber. The retaining bar is secured to the first outmost fin by fasteners such as screws (40). A pressing portion (36) is formed on the retaining bar, the pressing portion resiliently pressing one side wall of the fan. The fan is thus firmly retained in the chamber.

13 Claims, 2 Drawing Sheets

HEAT SINK ASSEMBLY WITH EMBEDDED FAN

BACKGROUND OF THE INVENTION

1. Field of the Invention

The present invention relates to heat sink assemblies, and particularly to a heat sink assembly having a fan embedded in a heat sink for providing forced ventilation.

2. Related Art

Developments in today's highly information-intensive society have led to remarkable improvements in performances of electronic devices. During operation of many contemporary electronic devices such as central processing units (CPUs), large amounts of heat are produced. Such heat must be quickly removed from the electronic device, to prevent the device from becoming unstable or being damaged. Typically, a heat sink together with a fan is attached to an outer surface of the device to facilitate removal of heat therefrom.

The fan is often attached to a top side of the heat sink. Examples of this kind of heat sink assembly are disclosed in U.S. Pat. No. 6,304,445 B1 and Taiwan Patent No. 319404. A fan fixing frame is used to secure the fan to the heat sink. The frame constitutes an extra piece of equipment for the assembly, thereby increasing costs. In addition, the fan is disposed outside the heat sink, which increases an overall size of the assembly. This militates against the modem trend toward miniaturization of electronic equipment. Furthermore, in operation, the hottest part of the heat sink is generally its base, which is located distal from the fan. Airflow emanating from the fan is already weakened by the time it has reached the base of the heat sink. The position of the fan does not allow the base of the heat sink to fully benefit from the airflow generated by the fan.

An improved heat sink assembly with a fan, which overcomes the above-mentioned problems, is desired.

BRIEF SUMMARY OF THE INVENTION

Accordingly, an object of the present invention is to provide a heat sink assembly having an embedded fan.

Another object of the present invention is to provide a heat sink assembly having a fan that facilitates significant cooling of a base of a heat sink.

To achieve the above-mentioned objects, a heat sink assembly of the present invention comprises a heat sink, a fan, and a retaining bar. The heat sink comprises a base, and a plurality of parallel fins extending upwardly from the base. The fins comprise a first outmost fin and a second outmost fin at opposite sides of the heat sink. The first outmost fin and intervening fins each define a longitudinal opening. All of the openings are aligned with each other, and cooperatively define a hexahedral chamber that is parallel with the base. The fan is received in the chamber. The retaining bar is secured to the first outmost fin by fasteners such as screws. A pressing portion is formed on the retaining bar, the pressing portion resiliently pressing one side wall of the fan. The fan is thus firmly retained in the chamber.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
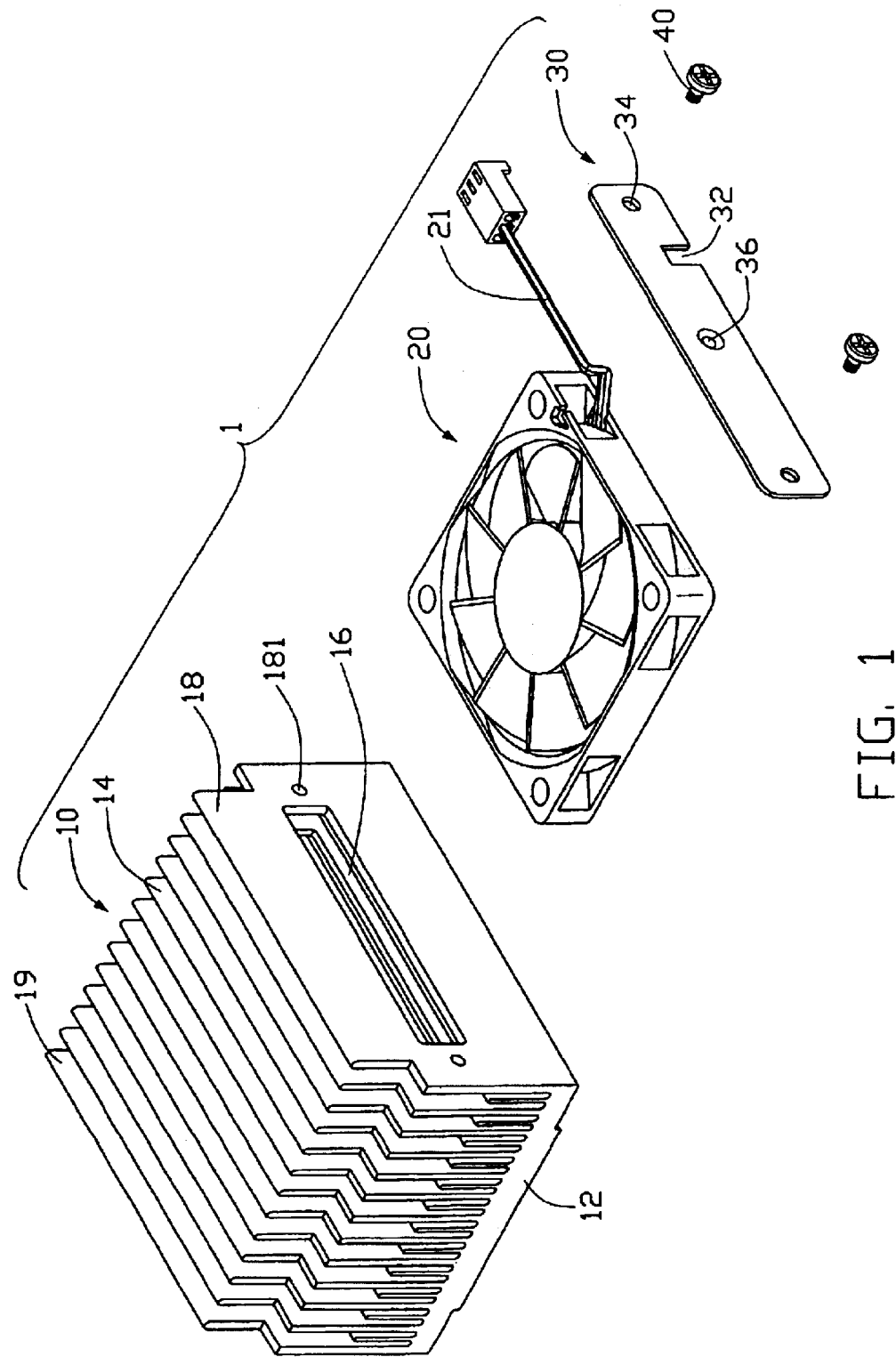
FIG. 1 is an exploded, isometric view of a heat sink assembly in accordance with a preferred embodiment of the present invention.

Referring to FIG. 1, a heat sink assembly in accordance with a preferred embodiment of the present invention comprises a heat sink 10, a fan 20 and a retaining bar 30.

The heat sink 10 comprises a base 12, and a plurality of parallel fins 14 extending upwardly from the base 12. The fins 14 comprise a first outmost fin 18 and a second outmost fin 19 at respective opposite sides of the heat sink 10. The first outmost fin 18 and the fins 14 each define a horizontal longitudinal opening. All the openings are aligned with each other, and cooperatively define a hexahedral chamber 16 that is parallel with the base 12. Two threaded holes 181 are defined in the first outmost fin 18, at opposite sides of the opening thereof respectively.

The retaining bar 30 is substantially a sheet of metal plate, and is larger than the opening of the first outmost fin 18. A pressing portion 36 is stamped inwardly from a middle of the retaining bar 30. Two through holes 34 are defined in opposite sides of the retaining bar 30 respectively. A cutout 32 is defined in a lower edge portion of one side of the retaining bar 30. A cable 21 of the fan 20 is extended through the cutout 32.

Figure 2:
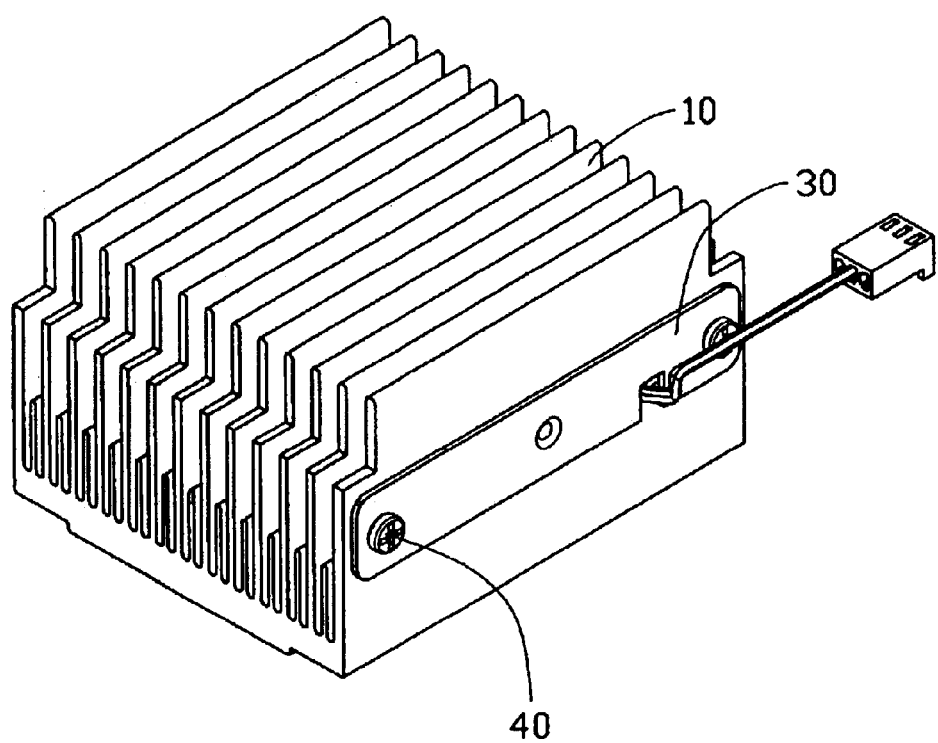
FIG. 2 is an assembled view of FIG. 1.

Referring also to FIG. 2, in assembly, the fan 30 is slid into the chamber 16 of the heat sink 10 until one side of the fan 30 abuts against the second outmost fin 19. The retaining bar 30 is secured to the first outmost fin 18 by two fasteners such as screws 40 being respectively extended through the through holes 34 of the retaining bar 30 and engaged in the threaded holes 181 of the first outmost fin 18. The pressing portion 36 of the retaining bar 30 resiliently presses one side wall of the fan 20, thereby firmly retaining the fan 20 in the chamber 16 of the heat sink 10.

In alternative embodiments of the present invention, the chamber 16 of the heat sink 10 may be perpendicular to the base 12 of the heat sink 10, or may be oriented at an oblique angle relative to the base 12. Correspondingly, the fan 20 may be perpendicular or oblique to the base 12.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:

a heat sink comprising a base and a plurality of fins extending from the base, a plurality of the fins each defining an opening therein, the openings cooperatively defining a chamber, a fan received in the chamber of the heat sink; retaining means retaining the fan in the chamber of the heat sink; and the retaining means comprises at least one retaining member secured to one outmost of the fins, and the at least one retaining member presses one side of the fan thereby retaining the fan in the chamber of the heat sink.

2. The heat sink assembly as described in claim 1, wherein the chamber is generally hexahedral.

3. The heat sink assembly as described in claim 1, wherein a pressing portion is provided on the at least one retaining member, and the pressing portion resiliently presses said one side of the fan.

4. The heat sink assembly as described in claim 1, wherein the outmost fin of the heat sink defines at least one threaded hole, the at least one retaining member defines at least one through hole, and at least one fastener extends through the at least one through hole and engages in the at least one threaded hole.

5. The heat sink assembly as described in claim 1, wherein at least one of the fins does not define an opening therein, and one side of the fan abuts said at least one of the fins.

6. The heat sink assembly as described in claim 1, wherein the chamber is parallel to the base of the heat sink.

7. The heat sink assembly as described in claim 1, wherein the chamber is perpendicular or oblique to the base of the heat sink.

8. A heat sink assembly comprising:

a heat sink defining a base, which is adapted to engage a heat generating device, and a plurality of fins projecting on the base;

a cavity formed in said fins and surrounded by the corresponding fins so as to prevent a fan, which is compliantly retainably received in said cavity, from being withdrawn along direction defined on planes of the corresponding fins, a retainer comprising at least one retaining member secured to one outmost of the fins, and the at least one retainer presses one side of the fan thereby retaining the fan in the cavity of the heat sink.

9. The assembly as described in claim 8, wherein said fins are perpendicular to said base.

10. The assembly as described in claim 8, wherein the cavity is fully circumferentially surrounded in each of the corresponding fins.

11. The assembly as described in claim 10, wherein the cavity in each of said corresponding fins is dimensioned to be slightly large than a cross-sectional dimension of the fan.

12. The assembly as described in claim 8, wherein said fins are integrally formed with the base.

13. The assembly as described in claim 8, wherein said fan is loaded into the cavity in a horizontal direction relative to the upright fins.

* * * * *